(12) United States Patent
Kaiser et al.

(10) Patent No.: US 7,165,198 B2
(45) Date of Patent: Jan. 16, 2007

(54) SYSTEM FOR TESTING AN INTEGRATED CIRCUIT USING MULTIPLE TEST MODES

(75) Inventors: Robert Kaiser, Kaufering (DE); Thilo Schaffroth, Roehrmoos (DE)

(73) Assignee: Infineon Technologies AG (DE)

( * ) Notice: Subject to any disclaimer, the term of this patent is extended or adjusted under 35 U.S.C. 154(b) by 517 days.

(21) Appl. No.: 10/196,338

(22) Filed: Jul. 16, 2002

(65) Prior Publication Data

US 2003/0028824 A1 Feb. 6, 2003

(30) Foreign Application Priority Data

Jul. 27, 2001 (DE) ................. 101 36 703

(51) Int. Cl.
*G01R 31/28* (2006.01)
(52) U.S. Cl. ............... 714/724; 714/36; 714/731
(58) Field of Classification Search ........... 714/724, 714/731, 36; 324/765
See application file for complete search history.

(56) References Cited

U.S. PATENT DOCUMENTS

| | | | | |
|---|---|---|---|---|
| 4,710,933 A | * | 12/1987 | Powell et al. ........... | 714/730 |
| 5,631,911 A | * | 5/1997 | Whetsel, Jr. ........... | 714/727 |
| 5,764,079 A | | 6/1998 | Patel et al. ........... | 326/40 |
| 5,850,509 A | * | 12/1998 | Fandrich et al. ........... | 714/29 |
| 6,046,947 A | * | 4/2000 | Chai et al. ........... | 365/201 |
| 6,060,924 A | * | 5/2000 | Sugano ........... | 327/202 |
| 6,598,192 B1 | * | 7/2003 | McLaurin et al. ........... | 714/726 |

FOREIGN PATENT DOCUMENTS

DE 199 50 838 6/2001

OTHER PUBLICATIONS

IEEE Std 1149.1-1990, *IEEE Standard Test Access Port and Boundary—Scan Architecture*, Feb. 15, 1990.

* cited by examiner

*Primary Examiner*—Guy Lamarre
*Assistant Examiner*—Esaw Abraham
(74) *Attorney, Agent, or Firm*—Fish & Richardson P.C.

(57) ABSTRACT

A system for testing an integrated circuit at a plurality of locations with a plurality of test modes includes a sequence of test-mode storage devices, each of which has an input and an output. The sequence includes at least first and second test-mode storage devices located at corresponding first and second locations on the integrated circuit and configured to store first and second test modes. The first test-mode storage device is configured to perform a shift operation by providing the first test-mode at its output. The second test-mode storage device has its input connected to the output of the first test-mode storage device. This second device is configured to perform the shift operation by receiving, at its input, the first test mode and providing, at its output, the second test-mode.

23 Claims, 1 Drawing Sheet

SYSTEM FOR TESTING AN INTEGRATED CIRCUIT USING MULTIPLE TEST MODES

RELATED APPLICATIONS

This application claims the benefit of the Jul. 27, 2001 filing date of German application 101 36 703.1, the contents of which are herein incorporated by reference.

FIELD OF INVENTION

The present invention relates to a logic for testing an integrated circuit and, in particular, to a logic for testing an integrated circuit at various locations to be tested in the integrated circuit.

BACKGROUND

A logic for testing which is not utilized in the normal operating mode is increasingly important for adequate fault coverage and for reducing test costs. In the prior art, for testing an integrated circuit which is intended to be tested at various locations or which is intended to be modified relative to the normal operating mode for testing at various locations, use is usually made of a test logic which is positioned centrally or at a small number of locations on a chip of an integrated circuit. Lines have to be routed from this test logic to each location to be tested in the integrated circuits, in order to carry out functional tests there. Numerous so-called test modes are required, which have to be stored on the chip and are passed as individual signals over the chip. Test modes comprise, for example, the modification or reprogramming of voltages and the single-stage or multistage modification of the temporal control, or timing.

One disadvantage in the prior art is that the additional outlay on wiring which is required for distributing individual test modes to the be locations to be tested in the integrated circuit limits the number of possible test modes, since virtually every test mode occupies an individual wiring channel on the chip. This considerably restricts the test possibilities for an integrated circuit.

A further disadvantage in the prior art is that costly chip area is taken up by the increased outlay on wiring, which is critical in particular for cost-sensitive standard products such as e.g. dynamic random access memories (DRAM).

SUMMARY

The object of the present invention is to provide a logic for testing an integrated circuit which enables a thorough and low-outlay testing of integrated circuits, and an integrated circuit comprising such a logic.

The logic for testing according to the invention has the advantage, inter alia, over the prior art that a more compact implementation of test logic and a drastic reduction of the wiring area are made possible by the invention.

In accordance with one preferred development, the logic for testing furthermore has a test logic block, which is arranged in the integrated circuit and drives each device for storing a test mode, in order to activate or deactivate the performance of shift operations for shifting the test modes between the devices for storing a test mode.

In accordance with one preferred development, in the logic for testing, the test modes are fed by a tester outside the integrated circuit to the logic for testing during a shift operation.

In accordance with a further preferred development, in the logic for testing, the tester is connected to the input of the first device for storing a test mode of the series of devices for storing a test mode, in order to feed the test modes to the logic for testing during shift operations, and is connected to the output of the last device for storing a test mode of the series of devices for storing a test mode, in order to return the test modes to the tester during shift operations.

In accordance with a further preferred development, in the logic for testing, the test logic block is connected to the input of the first devices for storing a test mode of the series of devices for storing a test mode, in order to feed the test modes to the logic for testing during shift operations.

In accordance with a further preferred development, in the logic for testing, for each test mode assigned to a location to be tested, the test logic block has one or more storage elements for storing the test mode.

In accordance with a further preferred development, in the logic for testing, the test logic block is furthermore connected to the output of the last device for storing a test mode of the series of devices for storing a test mode, in order to return the test modes to the test logic block during shift operations.

In accordance with a further preferred development, the test logic block furthermore has a counter for counting the number of shift operations carried out, in order to control the positionally correct feeding of the test modes assigned to locations to be tested to the devices for storing a test mode which are positioned at the locations to be tested.

In accordance with a further preferred development, the tester controls the test logic block via a bus.

In accordance with a further preferred development, each device for storing a test mode has a clock input for feeding a clock signal in order to temporally control the shift operations of the test modes with the clock signal.

In accordance with a further preferred development, the clock signal is supplied by a system in which the integrated circuit is operated, or by the tester.

In accordance with a further preferred development, the logic for testing furthermore has a clock generator which supplies the clock signal.

In accordance with a further preferred development, the output of a device for storing a test mode is connected to the location to be tested in the integrated circuit at which the device for storage is positioned, in order to feed the test mode to the location to be tested.

In accordance with a further preferred development, each device for storage has a further output for outputting the test mode, each device for storing a test mode being arranged in such a way that the further output outputs in each case the previously stored test mode during individual shift operations and outputs the respective newly stored test mode after deactivation of the shift operations by the test logic block.

In accordance with a further preferred development, in each case the further output of a device for storing a test mode is connected to in each case the location to be tested in the integrated circuit at which the device for storage is positioned, in order to feed the test mode to the location to be tested.

In accordance with a further preferred development, each device for storing a test mode has a register, which has an input for receiving the test mode, an output for outputting the test mode, a further output for outputting the test mode, the register being arranged in such a way that the further output outputs the previously stored test mode during individual shift operations and outputs in each case the newly stored test mode after deactivation of the shift operations by the test logic block, an activation input for the activation of the register by the test logic block, and a clock input for feeding a clock signal, in order to temporally control the shift operations of the test modes, and the series of devices for storing a test mode forms a shift register.

In accordance with a further preferred development, each register has a D-type storage element.

In accordance with a further preferred development, the test modes assigned to locations to be tested are arranged in accordance with the order of the devices for storing a test mode, which are in each case positioned at the location to be tested which is assigned to a test mode, in the series of devices for storing a test mode.

In accordance with a further preferred development, the integrated circuit has a random access memory (RAM) or a dynamic random access memory (DRAM).

BRIEF DESCRIPTION OF THE FIGURES

Preferred exemplary embodiments of the present invention are explained in more detail below with reference to the accompanying drawing.

In the figure.

DETAILED DESCRIPTION

Figure 1:
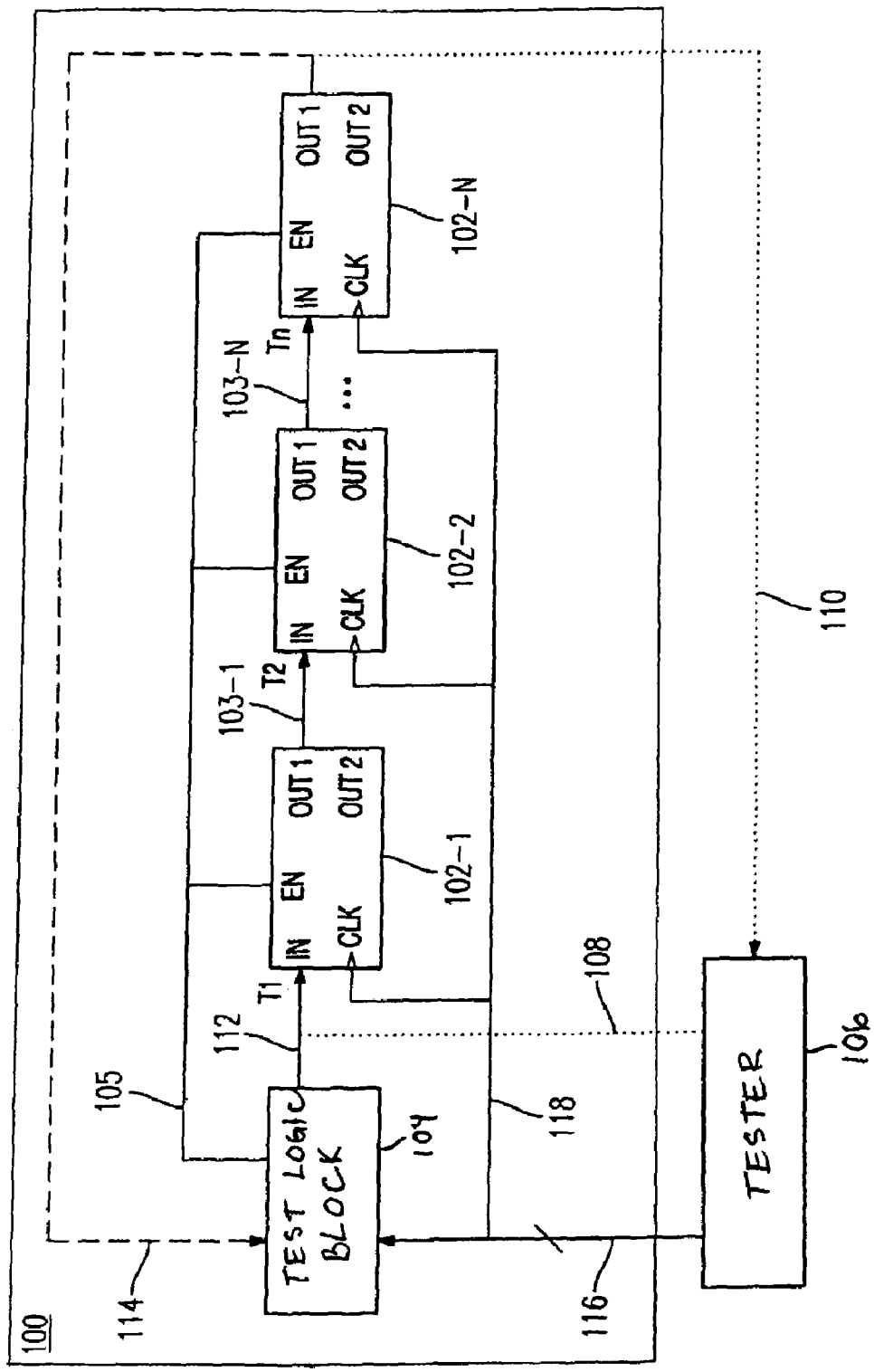
FIG. 1 shows a logic for testing an integrated circuit according to the present invention.

FIG. 1 shows a logic for testing an integrated circuit at various locations to be tested in the integrated circuit with test modes assigned to the locations to be tested. The integrated circuit to be tested is preferably arranged on a chip 100 and has for example a random access memory (RAM) or a dynamic random access memory (DRAM) which is intended to be tested at various locations by means of test modes which comprise, for example, the modification or the reprogramming of voltages or the modification, e.g. a single-stage or multistage modification, of the temporal coordination, or timing.

The logic for testing an integrated circuit has at least two devices 102 for storing a test mode, which each have an input IN for receiving the test mode and an output OUT 1 for outputting the test mode and which are each positioned at a location to be tested in the integrated circuit. The output OUT 1 of a device 102 for storing a test mode, such as e.g. of the device 102-1, is connected to the input IN of a further device 102 for storing a test mode, such as e.g. of the device 102-2, in order to form a series 102-1, 102-2, . . . , 102-N of devices 102 for storage. The devices 102 for storage are preferably connected to one another via lines 103 in which signals T1, T2, . . . , Tn, which have the test modes, are transmitted in each case. The test modes can be shifted during a shift operation in a direction along the series between the devices 102 for storage via the line 103, in order to shift each test mode to a device 102 for storing a test mode which is positioned at the location to be tested which is assigned to the test mode. Since each device 102 for storing a test mode is assigned to a specific [lacuna] to be tested, the test modes assigned to the locations to be tested are fed to the logic for testing an integrated circuit in accordance with the order of the devices 102 for storing a test mode. In order to control a shift operation within a device 102 for storage, each device 102 for storing a test mode furthermore has an activation input EN, to which can be applied an activation signal which is used to activate a shift operation.

The logic for testing an integrated circuit furthermore preferably has a test logic block 104, which is arranged in the integrated circuit on the chip 100 in order to activate or deactivate at least the performance of shift operations for shifting the test modes between the devices 102 for storing a test mode. To that end, the test logic block is connected to each device 102 for storage via a line 105 which feeds, to each device 102 for storage, an activation signal at the input EN, with which the device 102 for storage can be activated.

In a first exemplary embodiment of the logic for testing in accordance with the present invention, the test modes are fed by a tester 106, situated outside the integrated circuit or the chip 100, to the logic for testing during a shift operation or during shift operations. In this first exemplary embodiment, the tester 106 is connected to the input IN of the first device 102-1 for storing a test mode of the series 102-1, 102-2, . . . , 102-N of devices 102 for storing a test mode preferably via a line 108, in order to feed the desired test modes to the logic for testing or the devices 102 for storage during shift operations. The tester 106 is furthermore preferably connected via a further line 110 to the output OUT1 of the last device 102-N for storing a test mode of the series 102-1, 102-2, . . . , 102-N of devices 102 for storing a test mode in order to return the test modes to the tester 106 during shift operations. The standard pins of an integrated circuit, such as e.g. a DQ pin of a dynamic random access memory (DRAM), are preferably used for this feeding and returning of the test modes. Such an interconnection of the tester 106 with the devices 102 for storage makes it possible for no test mode to be lost during shift operations and for the outlay on circuitry on a chip 100 to be kept minimal.

In a second exemplary embodiment of the logic for testing an integrated circuit, the test logic block 104 is connected to the input IN of the first device 102-1 for storing a test mode of the series 102-1, 102-2, . . . , 102-N of devices 102 for storing a test mode preferably via a line 112, in order to feed the test modes to the logic for testing, beginning with the first device 102-1 for storage, during shift operations. In this exemplary embodiment, the feeding of the test modes from the tester 106 and the returning of the test modes to the tester 106 are dispensed with and, instead, the required logic is realized on the chip 100 in the test logic block 104. In this exemplary embodiment, therefore, for each test mode assigned to a device 102 for storage, the test logic block 104 has a storage element for storing the test mode which in each case "mirrors" the content of a device for storage. This storage element is set and programmed by the tester 106, and the test modes are then passed through the shift logic in the test logic block 104 to the correct location in the series of devices 102 for storage.

In a third exemplary embodiment of the logic for testing, the test logic block 104, as an extension to the preceding second exemplary embodiment, is furthermore connected to the output OUT 1 of the last device 102-N for storing a test mode of the series 101-1, 102-2, . . . , 102-N, preferably via a line 114, in order to return the test modes to the test logic block 104 during shift operations. Consequently, in this exemplary embodiment, the series of devices for storage, on the chip 100, is closed to form a ring. During the programming of the logic for testing an integrated circuit, the series 102-1, 102-2, . . . , 102-N of devices for storage is shifted through once cyclically, in which case, in accordance with the programming at the corresponding shift clock value, the stored value is overwritten in the test logic block 104, which can preferably be achieved by means of a counter comparison with a coded test mode applied by the tester 106. One advantage of this exemplary embodiment is that it is possible to dispense with "mirroring" and with storage elements in the test logic block 104 which are provided for storing a respective test mode assigned to a location to be tested.

In all of the exemplary embodiments described above, the test logic block 104 is preferably controlled or activated by the tester 106 via a bus 116. To that end, the customary command and address lines are used, for example, in a dynamic random access memory. Furthermore, in all of the exemplary embodiments described above, the test modes are preferably always switched on or programmed by the tester 106 and some of the tasks of the tester 106 are undertaken by the test logic block 104 configured with greater or lesser complexity.

In order to count the number of shift operations and to be able to perform the programming of the devices 102 for storing a test mode, the test logic block 104 preferably furthermore has a counter for counting the number of shift operations carried out, in order to control the positionally correct feeding of the test modes assigned to the locations to be tested to the devices 102 for storing a test mode which are positioned at the locations to be tested.

The counter in the test logic block 104 therefore ensures that the correct number of shift operations is performed, and that furthermore the chip 100 can be set automatically into a normal operating mode after the shift operations have elapsed. The devices 102 for storing a test mode furthermore preferably have a clock input CLK for feeding a clock signal via a line 118, in order to temporally control the shift operations of the test modes with the clock signal. The clock signal is supplied either by a system in which the integrated circuit is operated, or by the tester 106. The logic for testing may alternatively have a clock generator which generates and supplies the clock signal.

In a first variant of the devices 102 for storing a test mode, the output OUT1 of each device for storing a test mode is connected to the location to be tested in the integrated circuit at which the device 102 for storage is positioned, in order to feed the test mode to the location to be tested. The output OUT 1 is therefore used directly as the local test mode signal, and the state of the test mode changes its state during the shift operation.

In a second variant of the device 102 for storage, the device 102 for storage in each case has a further output OUT2 for outputting the test mode. In this case, each device 102 for storing a test mode is arranged in such a way that the further output OUT2 outputs in each case the previously stored test mode during individual shift operations and outputs the respective test mode newly stored in the respective device 102 for storage after deactivation of the shift operations or of a shift operation by the test logic block 104. The output OUT2 thus retains its value during the shift operation and accepts the value presently stored in the device for storage only with the deactivation of the shift operations. In this variant, the further output OUT2 of a device 102 for storing a test mode is connected to in each case the location to be tested in the integrated circuit at which the device 102 for storage is positioned, in order to feed the test mode to the location to be tested.

Each device 102 for storing a test mode preferably has in each case a register, e.g. a D-type storage element, which has an input IN for receiving the test mode, an output OUT1 for outputting the test mode and a further output OUT2 for outputting the test mode, the register being arranged in such a way that the further output outputs in each case the previously stored test mode during individual shift operations and outputs in each case the newly stored test mode after deactivation of the shift operations by the test logic block 104. The register furthermore has in each case an activation input IN for the activation of the register by the test logic block 104, in order temporally to control the shift operations of the test modes or to activate them by setting an activation signal or ENABLE signal (EN). The activation signal EN is set, and afterward the content of the registers is shifted toward the right by one position with each clock pulse, supplied by an internal clock generator or by the tester 106. The series of devices 102 for storage or the registers therefore form a shift register.

One advantage of the present invention is that the registers or the devices for storing a test mode can be positioned at the location where they are required or space is available.

A further advantage is that the registers can be distributed over the chip in accordance with their place of use, and, as shown in FIG. 1, can be connected up to form a shift register, and, therefore, the numerous additional wiring channels can be obviated.

A further advantage is that only three signals are used in the wiring. They are the system clock or a clock signal which is already present at many locations, for example as existing system clock, an activation signal and a signal T, which is communicated in each case between the output of a device for storage and the input of the following device for storage.

The present invention therefore enables a compact implementation of a logic for testing and a very great reduction of the wiring area.

Although the present invention is described above using preferred exemplary embodiments, it is not restricted thereto, but rather can be modified in diverse ways.

The invention claimed is:

1. A logic circuit for testing an integrated circuit at a plurality of locations within the integrated circuit with a plurality of test modes, the logic circuit comprising a sequence of test-mode storage devices, each of which has an input and an output, the sequence including at least:
    a first test-mode storage device for storing a first test mode, the first test-mode storage device
        being disposed at a first location selected from the plurality of locations, and
        being configured to perform a shift operation by providing the first test-mode at its output;
    a second test-mode storage device for storing a second test-mode, the second test-mode storage device
        being disposed at a second location selected from the plurality of locations,
        having its input connected to the output of the first test-mode storage device, and
        being configured to perform the shift operation by receiving, at its input, the first test mode and providing, at its output, the second test-mode.

2. The logic circuit of claim 1, further comprising a test logic block for controlling the shift operation, the test logic block being arranged in the integrated circuit and in communication with each test-mode storage device in the sequence.

3. The logic circuit of claim 2, wherein the test logic block is connected to an input of the first test-mode storage device of the sequence, thereby enabling the test logic block to provide a test mode thereto.

4. The logic circuit of claim 3, wherein the test logic block is connected to an output of a last test-mode storage device of the sequence.

5. The logic circuit of claim 3, wherein the test logic block comprises a counter for counting the number of shift operations carried out.

6. The logic circuit of claim 2, wherein the test logic block comprises a storage element for storing each test mode from the plurality of test modes.

7. The logic circuit of claim 2, further comprising
a tester for controlling the test logic block, the tester being external to the integrated circuit; and
a bus for providing communication between the tester and the test logic block.

8. The logic circuit of claim 2, wherein the first test-mode storage device comprises a further output for outputting:
a previously stored test mode when the test logic block activates a shift operation, and
a newly stored test mode when the test logic block deactivates a shift operation.

9. The logic circuit of claim 8, wherein the further output is in electrical communication with the integrated circuit at the first location, thereby enabling the first test-mode storage device to apply the first test mode at the first location.

10. The logic circuit of claim 2, wherein the sequence of test-mode storage devices forms a shift register and each test-mode storage device comprises:
a register having
an input for receiving the test mode,
an output for outputting the test mode, and
a further output for outputting the test mode,
the register being configured such that the further output outputs the previously stored test mode during a shift operation and outputs the newly stored test mode after deactivation of a shift operation by the test logic block;
an activation input in communication with the test logic block for activation of the register; and
a clock input for receiving a clock signal to temporally control the shift operation.

11. The logic circuit of claim 10, wherein the register comprises a D-type storage element.

12. The logic circuit of claim 2, wherein the test logic block is configured to assign a test mode intended for testing a designated location on the integrated circuit to a test-mode storage device disposed at that designated location.

13. The logic circuit of claim 1, further comprising a tester for controlling the shift operation, the tester being external to the integrated circuit and in communication with each test-mode storage device in the sequence.

14. The logic circuit of claim 13, wherein the tester is connected to an input of the first test-mode storage device of the sequence, thereby enabling the tester to provide a test mode thereto.

15. The logic circuit of claim 14, wherein the tester is connected to an output of a last test-mode storage device of the sequence.

16. The logic circuit of claim 13, wherein each test-mode storage device in the sequence comprises a clock input for receiving a clock signal to enable temporal control of the shift operation, each clock input being connected to the tester for receiving the clock signal therefrom.

17. The logic circuit of claim 1, wherein each test-mode storage device in the sequence comprises a clock input for receiving a clock signal to enable temporal control of the shift operation.

18. The logic circuit of claim 17, wherein each clock input is configured to receive the clock signal from a system in which the integrated circuit is operated.

19. The logic circuit of claim 17, further comprising a clock generator for providing the clock signal, the clock generator being connected to the clock input of each test-mode storage device from the plurality of test-mode storage devices.

20. The logic circuit of claim 1, wherein the output of the first test-mode storage device is in electrical communication with the integrated circuit at the first location, thereby enabling the first test-mode storage device to apply the first test mode at the first location.

21. An integrated circuit comprising a logic circuit as recited in claim 1.

22. The integrated circuit of claim 21, further comprising a random access memory.

23. The integrated circuit of claim 22, wherein the random access memory comprises a dynamic random access memory.

* * * * *